(12) United States Patent
Tanaka (10) Patent No.: US 11,040,518 B2
(45) Date of Patent: Jun. 22, 2021

(54) LAMINATED BODY AND METHOD OF PRODUCING SHAPED ARTICLE

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 66 days.

(21) Appl. No.: 15/939,391

(22) Filed: Mar. 29, 2018

(65) Prior Publication Data

US 2018/0281350 A1    Oct. 4, 2018

(30) Foreign Application Priority Data

Mar. 31, 2017    (JP) .............................. JP2017-070415

(51) Int. Cl.
*B32B 15/09*    (2006.01)
*B32B 15/20*    (2006.01)
(Continued)

(52) U.S. Cl.
CPC ................ *B32B 15/09* (2013.01); *B32B 7/12* (2013.01); *B32B 15/088* (2013.01);
(Continued)

(58) Field of Classification Search
None
See application file for complete search history.

(56) References Cited

U.S. PATENT DOCUMENTS

| 5,089,355 A * | 2/1992 | Morita .................... B32B 15/08 |
| | | 428/607 |
| 5,573,857 A * | 11/1996 | Auger ..................... B32B 15/08 |
| | | 428/480 |
| 2013/0071676 A1* | 3/2013 | Kammuri ................ B32B 15/08 |
| | | 428/457 |

FOREIGN PATENT DOCUMENTS

| EP | 2581220 A1 | 4/2013 |
| JP | 2002096419 A | 4/2002 |

(Continued)

OTHER PUBLICATIONS

Furukawa—JP 5474678 B2—Espacenet biblio page+Google English translation—Drawing metal foil—Friction coefficient—2014 (Year: 2014).*
Kuroda—WO 2016-140244 A1—Euro SR D#3—MT—manufacturing shield tape—2016 (Year: 2016).*
Search Report in European Application No. 18164741.3 dated Jul. 11, 2018, 8 pages.

(Continued)

*Primary Examiner* — Callie E Shosho
*Assistant Examiner* — John Vincent Lawler
(74) *Attorney, Agent, or Firm* — Marshall, Gerstein & Borun LLP (57) ABSTRACT

Provided is a laminated body of at least one metal foil and resin layers, which is suitable for drawing. The laminated body includes at least one metal foil and at least two resin layers. The laminated body has a thickness of 25 to 500 μm. In the laminated body, both surfaces of each metal foil are closely laminated to the resin layers, and the relationships: 60≤σY≤150, and 1.4≤σb/σY are satisfied, in which σY represents a nominal stress (MPa) at a nominal strain of 5% when a tensile test according to JIS K 7127: 1999 is performed on the laminated body, and σb represents a nominal stress (MPa) at a nominal strain at which the metal foil in the laminated body is broken when a tensile test according to JIS K 7127: 1999 is performed on the laminated body.

8 Claims, 1 Drawing Sheet

(51) Int. Cl.
   *B32B 38/12* (2006.01)
   *H05K 9/00* (2006.01)
   *B32B 7/12* (2006.01)
   *B32B 15/088* (2006.01)
   *B32B 15/092* (2006.01)
   *B32B 15/095* (2006.01)

(52) U.S. Cl.
   CPC .......... *B32B 15/092* (2013.01); *B32B 15/095* (2013.01); *B32B 15/20* (2013.01); *B32B 38/12* (2013.01); *H05K 9/0084* (2013.01); *H05K 9/0088* (2013.01); *B32B 2250/03* (2013.01); *B32B 2250/40* (2013.01); *B32B 2255/06* (2013.01); *B32B 2255/26* (2013.01); *B32B 2307/202* (2013.01); *B32B 2307/204* (2013.01); *B32B 2307/212* (2013.01); *B32B 2307/50* (2013.01); *B32B 2307/732* (2013.01); *B32B 2309/105* (2013.01); *B32B 2367/00* (2013.01); *B32B 2457/00* (2013.01)

(56) References Cited

FOREIGN PATENT DOCUMENTS

| | | | |
|---|---|---|---|
| JP | 2003-285002 A | 10/2003 | |
| JP | 2012009314 | * 1/2012 | ........... B32B 15/085 |
| JP | 2012009314 A | 1/2012 | |
| JP | 2013-144382 A | 7/2013 | |
| JP | 2015-142995 A | 8/2015 | |
| JP | 2017-005214 A | 1/2017 | |
| KR | 2013-0039325 A | 4/2013 | |
| WO | WO-2016/140244 A1 | 9/2016 | |
| WO | WO-2016140244 A1 * | 9/2016 | ............. B32B 15/08 |

OTHER PUBLICATIONS

Notice of Reasons for Refusal in JP Application No. 2017-070415 dated Nov. 4, 2020, 8 pages.
Office Action in KR Application No. 2018-0037253 dated May 30, 2019, 5 pages.

* cited by examiner

LAMINATED BODY AND METHOD OF PRODUCING SHAPED ARTICLE

TECHNICAL FIELD

The present invention relates to a laminated body of at least one metal foil and resin layers, which is suitable for drawing. The present invention also relates to a method of producing a shaped article using the laminated body.

BACKGROUND ART

Recently, high attention has been widely focused on global environmental issues, and environmentally-friendly motor vehicles equipped with secondary batteries such as electric vehicles and hybrid vehicles have progressively prevailed. These motor vehicles often employ a mode of converting direct current generated from the mounted secondary battery into alternating current through an inverter, and then supplying required electric power to the alternating current motor to provide driving force. Electromagnetic waves are generated due to switching operation of the inverter and the like. The electromagnetic waves are emitted not only from the motor vehicles but also from many electric and electronic devices including communication devices, displays and medical devices.

The electromagnetic waves may cause erroneous operation of precision devices, and cause radio disturbance of on-board audio equipment, radio equipment and the like. An adverse effect on a human body is further concerned. Therefore, countermeasures have been taken to cover the electric/electronic devices such as inverters with an electromagnetic wave shielding material formed by press-forming a metal sheet (for example, Japanese Patent Application Publication No. 2003-285002 A).

Weight reduction is required for many electric and electronic devices, which is also required for electromagnetic wave shielding materials. It is desired to reduce the thickness of the metal sheet for the weight reduction. However, if the thickness of the metal sheet is reduced, then ductility will be decreased, which cause a problem that the metal sheet is broken during a molding process. Therefore, there has been proposed a technique for improving an electromagnetic wave shielding property, a weight reduction property and formability by alternately laminating metal foils and resin layers (for example, Japanese Patent Application Publication No. 2017-5214 A1).

Figure 1:
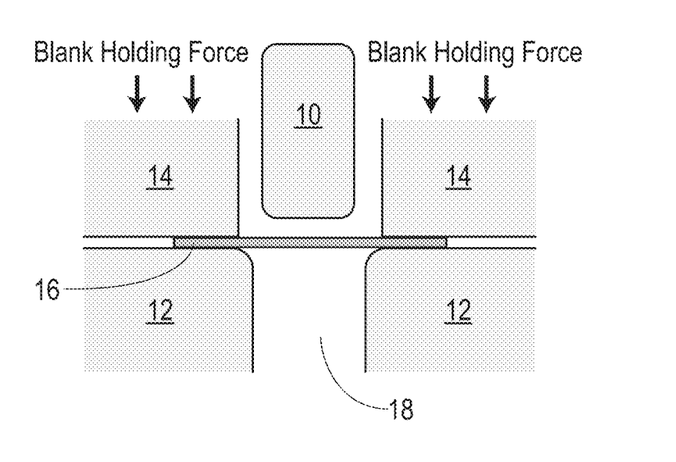
FIG. 1 is a schematic view for explaining drawing.

Drawing is known for a method of molding a laminated body of a metal foil and a resin layer. The drawing is a working method of forming bottomed containers having various shapes such as cylinders, square tubes, cones, and the like from a single metal sheet, which is said to be the highest degree of difficulty among press forming processes. Referring to FIG. 1, molds called a punch 10, a die 12 and a blank holder 14 are used for the drawing. The punch 10 is lowered in a state where a blank (a molding material) 16 is sandwiched between the plane surface of the die and the surface of the blank holder while applying predetermined force (blank holding force) to press the blank 16 into a die hole 18, so that the blank 16 is molded into a bottomed shape.

In the drawing, a certain area of the molding material is extended, as well as the molding material is molded by inflow of the molding material from the periphery of the die hole. The bottom surface of the container has a smaller strain because the bottom surface of the container is restrained by being brought into close contact with the punch, and the molding material flows in an upper portion of the side wall of the container, so that the plate thickness of the upper portion increases. Although the plate thickness decreases in a lower portion of the side wall because tensile strain is applied, the decrease in the plate thickness is smaller than that of stretch forming. Further, if the material is thin at the inflow portion, the portion will buckle to form wrinkles. In order to prevent this, the blank holding force must be increased. The increasing of the blank holding force results in increased friction between the mold and the molding material, increased resistance to material inflow, and easy breakage. Accordingly, there has been a problem that for a thinner molding material, particularly a molding material having a thickness of 500 µm or less, wrinkles are generated in the side wall of the container when the blank holding force is small, whereas the molding material is broken when the blank holding force is large. Therefore, there has been no choice but to increase the plate thickness.

To solve this problem, a technique of improving drawability has been proposed. In the technique, the drawability is improved by laminating a metal foil and a resin layer to increase the strength of a material while making the metal foil itself thin, and at the same time adjusting a dynamic friction coefficient of the resin layer. For example, Japanese Patent No. 4580079 B discloses that fine irregularity having a height of 0.1 to 25 µm is provided on a surface of an unstretched thermoplastic resin film, thereby lowering the dynamic friction coefficient and increasing a height limit during deep drawing. Further, Japanese Patent No. 5474678 B proposes that a thermal bonding polyolefin resin layer is formed on a first surface of a stainless steel foil and a urethane resin layer containing polyethylene-fluorine resin particles is formed on a second surface of the stainless steel foil. The polyethylene-fluororesin particles are dispersed in the urethane resin layer to provide a dynamic friction coefficient of 0.2 or less on the surface, thereby imparting lubricity and improving the drawability.

CITATION LIST

Patent Literatures

Patent Document 1: Japanese Patent Application Publication No. 2003-285002 A
Patent Document 2: Japanese Patent Application Publication No. 2017-5214 A
Patent Document 3: Japanese Patent No. 4580079 B
Patent Document 4: Japanese Patent No. 5474678 B

SUMMARY OF INVENTION

Technical Problem

The use of the laminated body of the metal foil and the resin layer as an electromagnetic wave shielding material is useful in terms of weight reduction. However, there would be a need for a thinner metal foil in order to achieve further weight reduction. Particularly, the drawing of a thinner metal foil into a complicated shape cannot cope with only by adjusting the dynamic friction force conventionally proposed, and there would be a need for further technical improvement. The present invention has been made in view of the above circumstances. An object of the present invention is to provide a laminated body of at least one metal foil and resin layers, which is suitable for drawing. Another object of the present invention is to provide a method of producing a shaped article using such a laminated body, more particularly a drawn article.

Solution to Problem

When a tensile stress is applied to a single metal foil, the entire metal foil is not uniformly deformed but is locally deformed. The stress concentrates on the local deformed portion and results in breakage, so that the ductility is not high. On the other hand, the resin layer tends to be uniformly deformed as a whole, so that it has higher ductility than that of the metal foil. When the metal foil and the resin layer are laminated in close contact with each other, the resin layer supports the metal foil, so that the metal foil is also uniformly deformed, the ductility is improved and the breakage during molding is suppressed. The ductility is further improved by supporting both surfaces of the metal foil by the resin layers, as compared with the supporting of only one surface of the metal foil by the resin layer.

Further, in the drawing, whether or not molding is possible is determined by a balance between the inflow resistance of the molding material and the strength of the molding material to be brought into contact with shoulder portion of the punch. The inflow resistance is determined by the blank holding force and some properties (strength, dynamic friction coefficient of the surface, r value) of the molding material. As described above, for the thinner molding material, the blank holding force should be increased in order to suppress the generation of wrinkles, so that the inflow resistance exceeds the strength of the molding material to be brought into contact with the shoulders of the punch, and as a result, the molding material is often broken at the shoulders of the punch. However, if the black holding force is decreased, the wrinkles are generated, so that a shaped article with good appearance cannot be obtained.

Because of these problems, the thinner metal foil could not be molded by the drawing. However, as a result of extensive studies, the present inventor has found that a laminated body in which at least one metal foil and resin layers are laminated can achieve both of lower inflow resistance and higher strength when 5% strain stress of the laminated body and tensile strength of the metal foil in the laminated body satisfy a predetermined relationship, and can have improved drawability. The present invention has been completed on the basis of the findings.

Thus, in one aspect, the present invention provides:

a laminated body comprising at least one metal foil and at least two resin layers, the laminated body having a thickness of 25 to 500 µm, wherein both surfaces of each metal foil are closely laminated to the resin layers; and wherein the relationships: $60 \leq \sigma Y \leq 150$, and $1.4 \leq \sigma b/\sigma Y$ are satisfied, in which $\sigma Y$ represents a nominal stress (MPa) at a nominal strain of 5% when a tensile test according to JIS K 7127: 1999 is performed on the laminated body, and $\sigma b$ represents a nominal stress (MPa) at a nominal strain at which the metal foil in the laminated body is broken when a tensile test according to JIS K 7127: 1999 is performed on the laminated body.

In one embodiment of the laminated body according to the present invention, the laminated body has an r value (Lankford value) at a logarithmic strain of 0.4 of from 0.7 to 4.0.

In another embodiment of the laminated body according to the present invention, the surfaces of the resin layers forming both outermost layers comprise a dynamic friction coefficient of from 0.15 to 0.45.

In yet another embodiment of the laminated body according to the present invention, both sides of each metal foil are closely laminated to the resin layers with an adhesive strength of 0.2 N/mm or more, respectively.

In yet another embodiment of the laminated body according to the present invention, each metal foil has a thickness of 4 to 100 µm.

In yet another embodiment of the laminated body according to the present invention, each resin layer has a thickness of 9 to 500 µm.

In yet another embodiment of the laminated body according to the present invention, both sides of each metal foil are closely laminated to the resin layers by thermocompression bonding without using an adhesive layer.

In another aspect, the present invention provides a method of producing a shaped article comprising molding the laminated body according to the present invention.

In one embodiment of the method of producing the shaped article according to the present invention, the method comprises carrying out the molding by drawing.

Advantageous Effects of Invention

According to the present invention, it is possible to obtain a thin and light laminated body having improved drawability. The laminated body can be molded to use a shaped article for various packaging materials, as well as the laminated body can be suitably utilized as an electromagnetic wave shielding material for electrical and electronic devices, because the laminated body contains the metal foil as a component.

DESCRIPTION OF EMBODIMENTS (1. Metal Foil)

Materials of the metal foil(s) forming the laminated body according to the present invention are not particularly limited, but metal materials with high conductivity are preferred in terms of improving a shielding property against an alternating magnetic field and an alternating electric field. Specifically, the metal foil may be preferably formed by a metal having a conductivity of $1.0 \times 10^6$ S/m (a value at 20° C.; the same will apply hereinafter) or more. The conductivity of the metal may be more preferably $10.0 \times 10^6$ S/m or more, and still more preferably $30.0 \times 10^6$ S/m or more, and most preferably $50.0 \times 10^6$ S/m or more. Examples of the metals include iron having a conductivity of about $9.9 \times 10^6$ S/m, nickel having a conductivity of about $14.5 \times 10^6$ S/m, aluminum having a conductivity of about $39.6 \times 10^6$ S/m, copper having a conductivity of about $58.0 \times 10^6$ S/m, and silver having a conductivity of about $61.4 \times 10^6$ S/m. In view of both electric conductivity and costs, aluminum or copper may be preferably employed for practical use. All of the metal foils forming the laminated body according to the present invention may be made of the same metal, or different metals may be used for each layer. Further, alloys containing the metals mentioned above may be used.

Various surface-treated layers may be formed on the surface(s) of the metal foil(s) for the purpose of adhesion promotion, environmental resistance, heat resistance and rust prevention. For example, the metal foil(s) may be subjected to Au plating, Ag plating, Sn plating, Ni plating, Zn plating, Sn alloy plating (Sn—Ag, Sn—Ni, Sn—Cu, and the like), a chromate treatment or the like, in order to improve environmental resistance and heat resistance that will be required when the metal surface is the outermost layer. These treatments may be combined. The Sn plating or the Sn alloy plating may be preferred in terms of costs. Further, the metal foil(s) may be subjected to the chromate treatment, a roughening treatment, Ni plating or the like in order to improve adhesion between the metal foil and the resin layer. These treatments may be combined. The roughening treatment may be preferred because it will easily provide the adhesion. Further, it is possible to provide at least one metal layer having high relative magnetic permeability in order to improve the shielding effect against the direct current magnetic field. Examples of the metal layer having high relative magnetic permeability include Fe—Ni alloy plating, Ni plating, and the like.

When using the copper foil, copper having a high purity may be preferred because it will improve the shielding performance. The purity may be preferably 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability (the formability encompasses drawability; the same applies hereinafter). When at least one alloy element is added to the copper foil to form a copper alloy foil, the total content of the alloy element(s) and unavoidable impurities may be less than 0.5% by mass. In particular, the copper foil may preferably contain one or more selected from the group consisting of Sn, Mn, Cr, Zn, Zr, Mg, Ni, Si, and Ag in the total amount of from 200 to 2000 ppm by mass, in order to improve elongation as compared with a pure copper foil having the same thickness.

The thickness of the metal foil(s) forming the laminated body according to the present invention may be preferably 4 µm or more per foil. The thickness of less than 4 µm may lead to difficulty of handling, as well as significantly decreased ductility of the metal foil, resulting in insufficient formability of the laminated body. Also, if the thickness of one foil is less than 4 µm, the lamination of a large number of metal foils will be required for obtaining the excellent electromagnetic shielding effect, thereby causing a problem of an increase in manufacturing costs. From such viewpoints, the thickness of one metal foil may be preferably 10 µm or more, and more preferably 15 µm or more, and still more preferably 20 µm or more, and even more preferably 25 µm or more, and still more preferably 30 µm or more. On the other hand, if the thickness of one foil exceeds 100 µm, the strength will be excessively increased, so that the effect of weight reduction may be deteriorated. Therefore, the thickness of one foil may preferably be 100 µm or less, and more preferably 50 µm or less, and even more preferably 45 µm or less, and still more preferably 40 µm or less.

Although one metal foil may be used for the laminated body, a plurality of metal foils forming the laminated body may be preferably laminated via resin layers, in terms of improving the formability and shielding performance. More preferably, three or more metal foils are laminated via the resin layers in terms of ensuring the excellent electromagnetic wave shielding property while decreasing the total thickness of the metal foils. The lamination of three or more metal foils significantly improves the shielding effect as compared with the single metal foil layer or two metal foil layers laminated via a resin layer, even if the metal foil(s) have the same total thickness. Even if the metal foils are directly stacked, the shielding effect will be improved due to an increase in the total thickness of the metal foils, but a remarkable improvement effect cannot be obtained. In other words, when a plurality of metal foils forming the laminated body are laminated via the resin layers, the total thickness of the metal foils needed to obtain the same electromagnetic wave shielding effect can be decreased, thereby achieving both of the weight reduction of the laminated body and the electromagnetic wave shielding effect.

The reason would be that the presence of the resin layers between the metal foils increases the number of reflections of electromagnetic waves to attenuate the electromagnetic waves. However, although the lamination of an increased number of metal foils tends to improve the electromagnetic shielding property, the increased number of the laminated metal foils increases the number of lamination steps, which will lead to an increase in manufacturing costs and will not provide further improvement of the shielding effect. Therefore, the number of the metal foils forming the laminated body may be preferably 5 or less, and more preferably 4 or less.

Therefore, in one embodiment of the laminated body according to the present invention, the total thickness of the metal foils may be 100 µm or less, or 80 µm or less, or 60 µm or less, or 40 µm or less. In one embodiment of the laminated body according to the present invention, the total thickness of the metal foils may be 4 µm or more, 8 µm or more, 12 µm or more, or 16 µm or more.

(2. Resin Layer)

In general, resin layer have higher ductility than metal foils. Therefore, by supporting both surfaces of each metal foil by resin layers, the ductility of the metal foil can be remarkably improved and the formability of the laminated body can be significantly improved. Even if the metal foils are directly stacked to each other, the effect of improving the formability cannot be obtained.

Resin layers having a larger impedance difference from the metal layer may be preferred in order to obtain the excellent electromagnetic shielding effect. To generate the larger impedance difference, the resin layers should have a smaller relative dielectric constant. More specifically, the relative dielectric constant may preferably be 10 (a value at 20° C.; the same will apply hereinafter) or less, and more preferably 5.0 or less, and still more preferably 3.5 or less. In principle, the relative dielectric constant is never smaller than 1.0. For generally available materials, the relative dielectric constant is at least about 2.0. Even if the relative dielectric constant is lowered to be close to 1.0, the increase in the shielding effect is limited, while a special and expensive material must be used. In view of the balance between the cost and the effect, the relative dielectric constant may preferably be 2.0 or more, and more preferably 2.2 or more.

For materials making up the resin layers, synthetic resins are preferable in terms of processability. Further, for the materials making up the resin layers, those in the form of film may be used. The resin layer may contain fiber reinforcing materials such as carbon fibers, glass fibers and aramid fibers. In terms of availability and processability, the synthetic resins include olefinic resins such as polyester (e.g. PET (polyethylene terephthalate), PEN (polyethylene naphthalate) and PBT (polybutylene terephthalate)); polyethylene and polypropylene, polyamides; polyimides; liquid crystal polymers; polyacetals; fluororesins; polyurethanes; acryl resins; epoxy resins; silicone resins; phenol resins; melamine resins; ABS resins; polyvinyl alcohol; urea resins; poly(vinyl chloride); polycarbonates; polystyrenes; styrene-butadiene rubbers; and the like. Among them, PET, polyamides and polyimides may be preferred in terms of tensile strength and ductility. The synthetic resins may be elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. Among them, polyimides, polybutylene terephthalate, polyamides, polyurethane and the like which are easily bonded to the metal foil by thermocompression bonding may be suitably used. All the resin layers used in the laminated body according to the present invention may be made of the same resin or they may be made of different resins for each layer.

The surfaces of the resin layers may be subjected to various surface treatments for the purpose of promoting adhesion to the metal foil, or the like. For example, the adhesion to the metal foil can be enhanced by performing primer coating or corona treatment on the surfaces of the resin films bonded to the metal foil.

The thickness of the resin layers is not particularly limited. However, in terms of enhancing the effect of improving the ductility of the metal foil, the total thickness of the resin layers may preferably be 9 μm or more, and more preferably 20 μm or more, and more preferably 40 μm or more, and still more preferably 80 μm or more, and even more preferably 100 μm or more. However, the total thickness of the resin layers may preferably be 500 μm or less, and more preferably 400 μm or less, and more preferably 300 μm or less, in terms of cost reduction.

Also, in view of ease of handling, the thickness of one resin layer may be preferably 4 μm or more, and more preferably 7 μm or more, and more preferably 10 μm or more, and still more preferably 20 μm or more, and still more preferably 40 μm or more, and even more preferably 80 μm or more, and even more preferably 100 μm or more. However, if the thickness of one resin layer is excessively increased, the costs will be increased. Therefore, the thickness of one resin layer may be preferably 250 μm or less, and more preferably 200 μm or less.

Examples of a method of closely laminating the resin layers and the metal foil(s) include thermocompression bonding, ultrasonic bonding, bonding with an adhesive, and a method of forming a film by applying a resin in molten state onto the metal foil and curing the resin, and the like. Among them, the thermocompression bonding is preferable in terms of the stability of the adhesive strength. The thermocompression bonding is a method of heating both of the resin layers and the metal foil(s) at a temperature of lower than melting points of both, and then applying a pressure to bring them into close contact with each other, and generating plastic deformation to bond them. However, in the present invention, the heating at a temperature exceeding the melting points of the resin layers as described below is considered to be the thermocompression bonding. It is also preferable to employ thermosonic bonding which is thermocompression-bonded while applying ultrasonic vibration. Although it is also possible to laminate the resin layers and the metal foil(s) via an adhesive, the adhesive will result in lower strength than the resin films as described below. Therefore, it is necessary to appropriately select the thickness or tensile elasticity of the adhesive so as not to inhibit the effect of improving the ductility of the metal foil that will be obtained by laminating the resin layers thereon. For the reasons, the thermal compression bonding is preferable because it is simple and can easily obtain the effect of improving the ductility. However, there are resin materials in which the thermocompression bonding is difficult, such as PET. Therefore, in this case, it is preferable to use the adhesive.

For the thermocompression bonding, the resin layers may be preferably heated at a temperature lower by 30° C. than the melting points of the resin layers or at a higher temperature, and more preferably heated at a temperature lower by 20° C. than the melting points of the resin layers or at a higher temperature, and even more preferably heated at a temperature lower by 10° C. than the melting points of the resin layers or at a higher temperature, in terms of improving the adhesion between the resin layers and the metal foil(s). However, if excessive heat is applied, the resin layers will be melted and pushed out by pressure to impair uniformity of the thickness and physical properties. Therefore, the heating during the thermocompression bonding may be preferably carried out at a temperature higher by 20° C. than the melting points of the resin layers or at a lower temperature, and more preferably at a temperature higher by 10° C. than the melting points of the resin layers or at a lower temperature, and still more preferably at a temperature lower than or equal to the melting points of the resin layers. Further, a pressure during the thermocompression bonding may preferably be 0.05 MPa or more, and more preferably 0.1 MPa or more, and even more preferably 0.15 MPa or more, in terms of improving the adhesion between the resin layers and the metal foil(s). However, even if the pressure is excessively applied, the adhesion will not be improved, and the resin layers are deformed to impair the uniformity of the thickness. Therefore, the pressure during the thermocompression bonding may preferably be 60 MPa or less, and more preferably 45 MPa or less, and still more preferably 30 MPa or less.

In general, adhesives have lower strength than resin films. Therefore, the adhesive layer having excessively large thickness tends to prevent improvement of the ductility of the metal foil that will be obtained by laminating of the resin layers thereon. On the other hand, if the adhesive layer is too thin, it will be difficult to apply the adhesive to the entire boundary surface between the metal foil and the resin film, and an unbonded portion will be formed. Therefore, the thickness of the adhesive layer may preferably be 1 μm or more and 20 μm or less, and more preferably 1.5 μm or more and 15 μm or less, and still more preferably 2 μm or more and 10 μm or less.

The strength of the adhesive layer may be increased so as not to prevent improvement of the ductility of the metal foil that will be obtained by laminating the resin layers thereon. However, if the strength is excessively increased, the ductility of the adhesive layer will tend to be decreased, thereby conversely preventing the improvement of the ductility. On the other hand, if the adhesive layer is too soft, the improvement of the ductility will be prevented, even within the thickness range as described above. The tensile elasticity of the adhesive layer may preferably be from 1 MPa to 1500 MPa, and more preferably from 3 MPa to 1000 MPa, and still more preferably from 5 MPa to 800 MPa. In the present invention, the tensile elasticity of the adhesive layer is measured according to JIS K7161-1: 2014, on an adhesive film obtained by applying the adhesive to be measured onto a substrate such as a film, drying and curing the adhesive, and then being peeled off from the substrate.

If the resin layers and the metal foil forming the laminated body are peeled off during the drawing, the effect of improving ductility cannot be obtained. Therefore, it is desirable that both sides of each metal foil are closely laminated to the resin layers with an adhesive strength of 0.2 N/mm or more, and preferably 0.4 N/mm or more, and even more preferably 0.6 N/mm or more, respectively.

In the present invention, the adhesive strength between the metal foil and the resin layer is measured by a 180° peel test according to JIS-C 5016: 1994. First, a sample having a width of 12.7 mm is prepared from the laminated body. One surface of the sample was fixed to a stainless steel plate, and measurement is carried out by peeling off the metal foil (plus the resin layer) from the resin layer at a peeling angle of 180° and at a rate of 50 mm/min in a direction perpendicular to the width direction of the sample.

(3. Laminated Body)

The laminated body may have a structure in which one, preferably two or more, and more preferably three or more metal foils, is/are closely laminated via the resin layers. In this case, each metal foil may preferably have such a structure that both surfaces of each metal foil are closely laminated to the resin layers, in order to improve the ductility of the metal foil to provide improved formability of the laminated body. In other words, embodiments where both outermost layers are formed of the resin layers, and embodiments where the resin layers and the metal foils are alternately laminated one by one is more preferable than embodiments where the metal foil(s) form(s) the outermost layer(s) of the laminated body, and embodiments where the inner layers of the laminated body have a position(s) in which a plurality of metal foils are laminated without interposing the resin layer(s).

Examples of the laminated structure of the laminated body include the following structures:

(1) a resin layer/a metal foil/a resin layer;

(2) a resin layer/a metal foil/a resin layer/a metal foil/a resin layer; and (3) a resin layer/a metal foil/a resin layer/a metal foil/a resin layer/a metal foil/a resin layer.

Here, it should be understood that a single "resin layer" as used herein includes a laminated body of a plurality of resin layers without interposing a metal foil(s). In other words, in the present invention, a plurality of resin layers laminated via no metal foil(s) are considered to be the single resin layer. Further, in the present invention, the adhesive layer is also considered to be the resin layer.

Therefore, for example, when the laminated body has a laminated structure as shown in the following item (4), a laminated portion of "a resin film/an adhesive layer" is considered to be a single "resin layer", and the laminated body is considered to have a laminated structure as shown in the following item (4').

(4) (a resin film/an adhesive layer)/a metal foil/(an adhesive layer/a resin film layer);

(4') a resin layer/a metal foil/a resin layer.

Similarly, when the laminated body has a laminated structure as shown in the following item (5), a laminated portion of "a resin film/an adhesive layer" and a laminated portion of "an adhesive layer/a resin film/an adhesive layer" are considered to be a single "resin layer", respectively, and the laminated body is considered to have a laminated structure as shown in the following (5').

(5) (a resin film/an adhesive layer)/a metal foil/(an adhesive layer/a resin film layer/an adhesive layer)/a metal foil/(an adhesive layer/a resin film);

(5') a resin layer/a metal foil/a resin layer/a metal foil/a resin layer.

In terms of improving the formability of the laminated body, the thickness of the laminated body may preferably be 25 μm or more, and more preferably 50 μm or more, and still more preferably 100 μm or more. However, in terms of weight reduction, the thickness of the laminated body may preferably be 500 μm or less, and more preferably 400 μm or less, and still more preferably 300 μm or less.

In the drawing, as the strength, specifically 5% strain stress, of the molding material is decreased, bending resistance and unbending resistance at the shoulder portion of the die is decreased accordingly. Since the resistance at the shoulder portion of the die are increased as a drawing depth becomes deeper, it is important to reduce the resistance when deeply drawing the molding material. According to the test results obtained by the present inventor, assuming that a nominal stress at a nominal strain of 5% (which may be referred to as "5% strain stress of the laminated body", hereinafter) when performing a tensile test according to JIS K 7127: 1999 is defined as $\sigma Y$ (MPa), the value of $\sigma Y$ may preferably be 150 MPa or less, and more preferably 135 MPa or less, and still more preferably 120 MPa or less. On the other hand, if the value of $\sigma Y$ is too small, buckling tends to occur at the inflow portion of the material and wrinkles tends to be generated. Therefore, the value of $\sigma Y$ may preferably be 60 MPa or more, and more preferably 70 MPa or more, and even more preferably 80 MPa or more.

In the present invention, the 5% strain stress ($\sigma Y$) of the laminated body is measured by the following method. Four samples each having a width of 12.7 mm×a length of 150 mm are cut out of the laminated body. The tensile direction of the laminated body is changed by varying the longitudinal directions of the samples such that the longitudinal direction of the second sample differs by 30°, the longitudinal direction of the third sample differs by 60°, and the longitudinal direction of the fourth sample differs by 90°, relative to the longitudinal direction of the first sample. The 5% strain stress ($\sigma Y$) of each sample is measured by subjecting each sample to a tensile test in the longitudinal direction of each sample at a temperature of 25° C. and at a tensile rate of 50 mm/min in accordance with JIS K 7127: 1999, and an average value for the four samples is considered to be the measured value.

Further, if the strength of the molding material to be brought into contact with the shoulder portion of the punch is sufficiently high relative to the resistance at the shoulder portion of the die, the molding material is not broken and can be deeply drawn. Here, a nominal stress at a nominal strain at which the metal foil(s) in the laminated body is broken when the tensile test according to JIS K 7127: 1999 is performed on the laminated body (the nominal strain may be referred to as "tensile strength ($\sigma b$) of the metal foil in the laminated body", hereinafter) is defined as $\sigma b$ (MPa). According to the examination results obtained by the present inventor, the laminated body is hardly broken and the drawability are significantly improved when the 5% strain stress of the laminated body ($\sigma Y$) and the tensile strength ($\sigma b$) of the metal foil(s) in the laminated body satisfy the relationship: $1.4 \leq \sigma b/\sigma Y$. More preferably, they may satisfy the relationship: $1.5 \leq \sigma b/\sigma Y$, and even more preferably the relationship: $1.6 \leq \sigma b/\sigma Y$. Although the upper limit of the ratio $\sigma b/\sigma Y$ is not specifically set, it is usually 3.0 or less. In the laminated body, the value of $\sigma b$ is larger than the tensile strength of the metal foil alone, because both surfaces of the metal foil are supported by the resin layers.

In the present invention, the tensile strength ($\sigma b$) of the metal foil in the laminated body is measured by the following method. Four samples each having a width of 12.7 mm×a length of 150 mm are cut out of the laminated body. The tensile direction of the laminated body is changed by varying the longitudinal directions of the samples such that the longitudinal direction of the second sample differs by 30°, the longitudinal direction of the third sample differs by 60°, and the longitudinal direction of the fourth sample differs by 90°, relative to the longitudinal direction of the first sample. The tensile strength (σb) of the metal foil in each sample is measured by subjecting each sample to a tensile test in the longitudinal direction of each sample at a temperature of 25° C. and at a tensile rate of 50 mm/min in accordance with JIS K 7127: 1999, and an average value for the four samples is considered to be the measured value.

It is preferable that in addition to the σY and σb/σY, an r value (Lankford value) of the laminated body is appropriately adjusted in order to reduce the blank holding force. The r value (Lankford value) is a value which is obtained by dividing "logarithmic strain in the plate width direction" at the time of application of strain in the longitudinal direction by "logarithmic strain in the plate thickness direction", and which indicates that deformation in the plate width direction tends to occur as the value is larger. When a drawing force is applied, a material having a larger r value tends to shrink in the circumferential direction, and wrinkles due to buckling are hardly generated, so that a decreased blank holding force can be chosen. According to the examination results obtained by the present inventor, the r value of the laminated body at the logarithmic strain of 0.4 is preferably 0.7 or more, and more preferably 1.0 or more, and even more preferably 1.1 or more, and still more preferably at least 1.2. On the other hand, if the r value is too large, the material tends to excessively shrink in the circumferential direction and causes the wrinkles. Therefore, the r value of the laminated body at the logarithmic strain of 0.4 may preferably be 4.0 or less, and more preferably 3.5 or less, and still more preferably 3.0 or less.

In the present invention, the r value is measured by the following method. Four samples each having a width of 12.7 mm×a length of 150 mm and each marked with 2.5 mm square lattice throughout its surface are cut out of the laminated body. The tensile direction of the laminated body is changed by varying the longitudinal directions of the samples such that the longitudinal direction of the second sample differs by 30°, the longitudinal direction of the third sample differs by 60°, and the longitudinal direction of the fourth sample differs by 90°, relative to the longitudinal direction of the first sample. Each lattice is composed of sides parallel to the longitudinal direction of each sample and sides in a direction perpendicular to the longitudinal direction of each sample. In accordance with JIS K 7127: 1999, the logarithmic strain of 0.4 is applied to each sample in the longitudinal direction of each sample at a tensile rate of 50 mm/min and at a temperature of 25° C., and then unloaded. The lattice near the center of each sample is selected and displacements in the longitudinal direction and in the width direction are measured by means of a toolmaker's microscope. Further, assuming that the volume of the laminated body is constant before and after the tensile test, the thickness of each sample is calculated from the displacements in the longitudinal direction and in the width direction. The r value of each sample is calculated from the actually measured displacement in the width direction and the calculated thickness, and an average value for the four samples is considered to be the measured value.

When a dynamic friction coefficient between the molding material and the die as well as a dynamic friction coefficient between the molding material and the blank holder are small during the drawing, the frictional force can be reduced even if the blank holding force is increased, so that the molding material is hardly broken during the drawing. Therefore, the dynamic friction coefficient of the surface of the resin layers that form both outermost layers of the laminated body may preferably be 0.45 or less, and more preferably 0.40 or less, and even more preferably 0.35 or less. However, the dynamic friction coefficient of the surface of the resin layers that form both outermost layers of the laminated body is excessively small, the inflow resistance will be excessively decreased, which causes the wrinkles. Therefore, the dynamic friction coefficient may preferably be 0.15 or more, and more preferably 0.18 or more, and still more preferably 0.2 or more. In the present invention, the dynamic friction coefficient is measured in accordance with JIS K 7125: 1999.

As used herein, the "stress" refers to "nominal stress" and the "strain" refers to "nominal strain", unless otherwise noted.

Properties of the laminated body depend on properties of the resin layers, properties of the metal foil(s) and a volume ratio of both. Therefore, parameters such as the 5% strain stress (σY), the ratio σb/σY, the r value and the dynamic friction coefficient of the laminated body can be controlled by adjusting the properties of the resin layers, the properties of the metal foil(s), and the volume ratio of both.

The 5% strain stress (σY) of the laminated body becomes higher by increasing the 5% strain stress (σY) of the resin layer(s), increasing the 5% strain stress (σY) of the metal foil(s) or increasing the thickness of either the resin layer(s) or the metal foil(s) having higher 5% strain stress (σY). Conversely, the 5% strain stress (σY) of the laminated body becomes lower by decreasing the 5% strain stress (σY) of the resin layer(s), decreasing the 5% strain stress (σY) of the metal foil(s), or increasing the thickness of either the resin layer(s) or the metal foil(s) having lower 5% strain stress (σY). For example, the 5% strain stress (σY) of a biaxially stretched film such as a PET film is generally increased as the draw ratio is increased, and is decreased as the draw ratio is decreased. The 5% strain stress (σY) of the resin layer(s) can also be adjusted by incorporating plural types of monomers to copolymerize them. The 5% strain stress (σY) of the metal foil(s) is increased as the degree of rolling is increased, and is decreased as the degree of rolling is decreased. The 5% strain stress (σY) can also be changed by adding an element(s) to the metal foil(s).

When the ductility of the laminated body is increased, work hardening until breakage is increased so that the ratio σb/σY is increased. To increase the work hardening of the laminated body, a resin exhibiting large work hardening may be used. For example, in a biaxially stretched resin, the work hardening can be increased by decreasing the draw ratio or by blending monomers which inhibit crystallization during stretching. Also, it is necessary to optimize the combination of the resin layer and the metal foil in order to increase the ductility. In general, the resin layer has higher ductility. Therefore, the ductility can be increased by increasing the volume fraction of the resin layer.

The r value of the metal foil can be adjusted by adding an element(s) or depending on the producing methods. For example, the r value is increased as the rolling reduction ratio of the final rolling is increased. The r value of the resin layer can be controlled by adjusting the draw ratio, the drawing rate, the temperature during the drawing, the proportion between the draw ratio in the longitudinal direction and the draw ratio in the width direction, and the like.

The dynamic friction coefficient of the surface of the resin layer varies depending on the composition of the resin and additives, and resins having various values are commercially available. The dynamic friction coefficient can be changed while maintaining the mechanical properties by forming a separate layer with a thickness of several nanometers having a molecular structure different from the resin layer on the outermost surface of the resin layer (primer treatment).

Various shaped articles can be produced by molding, especially drawing, the laminated body according to the present invention. The resulting shaped article can be used as a packaging material. The laminated body according to the present invention can be suitably used as an electromagnetic wave shielding material for electric and electronic devices. In particular, the laminated body according to the present invention can be suitably used for applications of shielding electromagnetic waves emitted from electric/electronic devices (for example, inverters, communication devices, resonators, electron tubes/discharge lamps, electric heating devices, electric motors, generators, electronic components, printed circuits, medical devices and the like).

EXAMPLES

Examples of the present invention are described below together with comparative examples, which are provided for better understanding of the present invention and its advantages, and are not intended to limit the invention.

(1. Preparation of Metal Foil)

The following materials were prepared as metal foils. The conductivity was measured by the double bridge method of JIS C 2525: 1999.

Cu: a rolled copper foil (electric conductivity at 20° C.: $58.0 \times 10^6$ S/m; thickness: see Table 1); only in Example 14, an electrolytic copper foil (conductivity at 20° C.: $58.0 \times 10^6$ S/m; thickness: see Table 1)

For the rolled copper foil, "a pure copper foil" with no added element and "a copper alloy foil" with 0.2 wt % of Ag added, which decreased the 5% strain stress, were used. In should be noted that there is substantially no change in the conductivity because of the addition of a minor amount of Ag.

Al: an aluminum foil (conductivity at 20° C.: $39.6 \times 10^6$ S/m; thickness: see Table 1)

Ni: a nickel foil (conductivity at 20° C.: $14.5 \times 10^6$ S/m, thickness: see Table 1)

Fe: an iron foil (conductivity at 20° C.: $9.9 \times 10^6$ S/m; thickness: see Table 1)

SUS: a stainless steel foil (conductivity at 20° C.: $1.4 \times 10^6$ S/m; thickness: see Table 1)

<Surface Treatment>

The surface treatment was carried out on both surfaces of the metal foil according to the conditions as described in Table 1 depending on the test numbers. In the tables, the symbol "−" means that no surface treatment was carried out.

Roughening Treatment: using a roughening treatment solution (Cu: from 10 to 25 g/L; $H_2SO_4$: from 20 to 100 g/L; temperature: from 25 to 35° C.), electrolysis was performed at a current density of from 30 to 70 A/dm² for 1 to 5 seconds. Then, Ni—Co plating was performed at a temperature of from 30 to 50° C. and at a current density of from 1 to 4 A/dm² using a Ni—Co plating solution (Co ion concentration: from 5 to 15 g/L; Ni ion concentration: from 5 to 15 g/L).

Silane Treatment: the immersion treatment in an epoxysilane treatment solution (epoxy silane: an aqueous solution of 0.1 to 2 wt %) was carried out.

Chromate Treatment: electrolysis was carried out at a current density of from 0.5 to 2 A/dm² using a chromate bath ($K_2Cr_2O_7$: from 0.5 to 5 g/L; temperature: from 50 to 60° C.).

Ni Plating+Chromate Treatment: using a Ni plating bath (watts bath with a Ni ion concentration of from 15 to 25 g/L), Ni plating was carried out at a plating solution temperature of from 30 to 50° C. and at a current density of from 1 to 4 A/dm², and the chromate treatment was then carried out in the same way as described above.

(2. Preparation of Resin Layer)

The following materials were prepared as resin films. All of them are commercially available products. The relative dielectric constant was measured by the method B described in the standard JIS C2151: 2006.

PET: a polyethylene terephthalate film (relative dielectric constant at 20° C.: from 3.0 to 3.5; melting point: 220° C.; thickness: see Table 1)

For PET, the 5% strain stress, the r value and the dynamic friction coefficient of the PET film alone were changed by using PET films having various grades from multiple manufacturers. By changing the 5% strain stress, the r value and the dynamic friction coefficient of the PET film alone, the 5% strain stress, the r value and the dynamic friction coefficient of the laminated body are also changed.

PI: a polyimide film (relative dielectric constant at 20° C.: 3.5; melting point: none; thickness: see Table 1)

PA: a polyamide film (relative dielectric constant at 20° C.: 6.0; melting point: 300° C.; thickness: see Table 1)

In addition, the following isocyanate-curing type polyurethane adhesive was prepared as the adhesive.

Adhesive: a main agent: RU-80; a curing agent: H-5, all of which are available from Rock Paint Co., Ltd.

The tensile elasticity after curing of the adhesive was measured using a precision universal testing apparatus AGS-X available from Shimadzu Corporation according to the method as described above and was found that it was 600 MPa.

(3. Preparation of Laminated Body)

Various laminated bodies having the laminated structures as shown in Table 1 were produced using the metal foils and the resin films as described above. In Table 1, the order of members described in the column of "Laminated Structure" and the order of members described in the column of "Thickness of Each Member" are the same. The metal foil and the resin film were laminated such that the areas of the bonding surfaces were the same and they did not protrude from each other. In Examples where the PET was used for the resin layer, the adhesive was applied onto the bonding surface of the PET by means of a bar coater (available from Daiichi Rika Co., Ltd.). The thickness of the adhesive layer was adjusted by the solid content of the adhesive and the count of the bar coater. The adhesive was then dried at 80° C. for 1 minute to volatilize excess solvent. The metal foil was attached, and then maintained at 40° C. for 7 days to promote the curing reaction such that the metal foil and the resin layer were closely laminated. In this case, one resin layer is made of a laminated body of PET and an adhesive layer, according to the definition as described above.

(4. Tensile Test)

For each laminated body obtained by the above procedures, four samples each having a width of 12.7 mm×a length of 150 mm were cut out. The tensile direction of the laminated body was changed by varying the longitudinal directions of the samples such that the longitudinal direction of the second sample differed by 30°, the longitudinal direction of the third sample differed by 60°, and the longitudinal direction of the fourth sample differed by 90°, relative to the longitudinal direction of the first sample. The 5% strain stress (σY) of each sample and the tensile strength (σb) of the metal foil in each sample were measured by subjecting each sample to a tensile test in the longitudinal direction of each sample at a temperature of 25° C. and at a tensile rate of 50 mm/min, using a tensile tester Model AGS-X available from Shimadzu Corporation, in accordance with JIS K 7127: 1999, and average values for the four samples were considered to be the 5% strain stress (σY) of the laminated body and the tensile strength (σb) of the metal foil in the laminated body. The results are shown in Table 1.

(5. Measurement of r Value)

For each laminated body obtained by the above procedures, four samples each having a width of 12.7 mm×a length of 150 mm and each marked with 2.5 mm square lattice throughout its surface were cut out. The tensile direction of the laminated body was changed by varying the longitudinal directions of the samples such that the longitudinal direction of the second sample differed by 30°, the longitudinal direction of the third sample differed by 60°, and the longitudinal direction of the fourth sample differed by 90°, relative to the longitudinal direction of the first sample. Each lattice was composed of sides parallel to the longitudinal direction of each sample and sides in a direction perpendicular to the longitudinal direction of each sample. In accordance with JIS K 7127: 1999, the logarithmic strain of 0.4 was applied to each sample in the longitudinal direction of each sample at a tensile rate of 50 mm/min and at a temperature of 25° C., using a tensile tester Model AGS-X available from Shimadzu Corporation, and then unloaded. The lattice near the center of each sample was selected and displacements in the longitudinal direction and in the width direction were measured by means of a toolmaker's microscope. Further, assuming that the volume of the laminated body was constant before and after the tensile test, the thickness of each sample was calculated from the displacements in the longitudinal direction and in the width direction. The r value of each sample was calculated from the actually measured displacements in the width direction and the calculated thickness, and an average value for the four samples was considered to be the measured value for the r value. The results are shown in Table 1.

(6. Dynamic Friction Coefficient)

Using a surface property measuring instrument (TYPE-HEIDON-14, available from Shinto Scientific Co., Ltd.), the dynamic friction coefficient according to JIS K 7125: 1999 was determined by measuring a load generated when a steel ball having a diameter of 10 mm was pressed against the surface of each laminated body obtained by the above procedures under a load of 1 N and slided at a rate of 150 mm/min. The results are shown in Table 1.

(7. Molding Test)

Circular blanks having a diameter of from 50 to 65 mm were prepared from each laminated body obtained by the above procedures. Each blank was subjected to a molding test for drawing into a cylindrical article using a punch having a diameter of 30 mm. A plurality of punches and dies were prepared, and clearance (a gap when the punch entered the die), punch shoulder R, and die shoulder R were adjusted according to the thickness of the blank. The presence or absence of wrinkle and crack of the shaped article after the molding test was observed. Cracks was confirmed by observing not only the outermost layer of the shaped article, but also the interior with X-ray CT (micro-CT scanner, TOSCANER 32251 μhd, available from TOSHIBA IT CONTROL SYSTEMS CORPORATION; a tube current of 120 μA; a tube voltage of 80 kV). The drawing height of the shaped article that was most deeply drawn, among those that could be drawn without generating wrinkle and crack, was measured. The shaped article having a drawing depth of 12 mm or more was represented by "⊚" (a double circle), the shaped article having a drawing depth of 9 mm or more and less than 12 mm was represented by "○" (a single circle), the shaped article having a drawing depth of 6 mm or more and less than 9 mm was represented by "Δ" (a triangle), and the shaped article having a drawing depth of less than 6 mm was represented by "x" (a cross). The results are shown in Table 1.

(8. Adhesive Strength)

For the laminated bodies according to Examples 1 to 3, the adhesive strength between the metal foil and the resin layer was measured by a 180° peel test according to JIS-C 5016: 1994. First, a sample having a width of 12.7 mm was prepared from each laminated body. One surface of each sample was fixed to a stainless steel plate, and measurement was carried out by peeling off the metal foil (plus the resin layer) from the resin layer at a peeling angle of 180° and at a rate of 50 mm/min in a direction perpendicular to the width direction of the sample. The results are shown in Table 1. Among the adhesive strengths in Table 1, the values on the left side represent the adhesive strength between the resin layer on the left side and the metal foil at the center, and the values on the right side represent the adhesive strength between the resin layer on the right side and the metal foil at the center.

TABLE 1-1

| | Laminated Structure | Surface Treatment of Metal Foil | Thickness of Each Member μm | Thickness of Each Adhesive Layer μm | Adhesive Strength between Metal Foil and Resin Layer N/mm | Total Thickness mm |
|---|---|---|---|---|---|---|
| Example 1 | PET/Copper Alloy Foil/PET | Roughening Treatment | 200, 70, 200 | 10 | 0.62, 0.63 | 490 |
| Example 2 | PET/Pure Copper Foil/PET | Roughening Treatment | 100, 18, 100 | 6 | 0.61, 0.58 | 230 |
| Example 3 | PET/Copper Alloy Foil/PET | Silane Treatment | 50, 18, 50 | 3 | 0.38, 0.42 | 124 |
| Example 4 | PET/Pure Copper Foil/PET | Roughening Treatment | 50, 18, 50 | 3 | — | 124 |
| Example 5 | PET/Pure Copper Foil/PET | Roughening Treatment | 25, 9, 25 | 3 | — | 65 |
| Example 6 | PET/Copper Alloy Foil/PET | Roughening Treatment | 50, 18, 50 | 10 | — | 138 |
| Example 7 | PET/Pure Copper Foil/PET | Roughening Treatment | 38, 18, 38 | 3 | — | 100 |
| Example 8 | PET/Copper Alloy Foil/PET | Roughening Treatment | 50, 18, 50 | 3 | — | 124 |
| Example 9 | PET/Copper Alloy Foil/PET | Roughening Treatment | 50, 18, 50 | 3 | — | 124 |
| Example 10 | PET/Copper Alloy Foil/PET | Roughening Treatment | 50, 18, 50 | 10 | — | 138 |
| Example 11 | PET/Copper Alloy Foil/PET | Chromate Treatment | 50, 18,50 | 3 | — | 124 |
| Example 12 | PI/Copper Alloy Foil/PI | Roughening Treatment | 50, 18, 50, No adhesive | 0 | — | 118 |
| Example 13 | PA/Copper Alloy Foil/PA | Roughening Treatment | 50, 18, 50, No adhesive | 0 | — | 118 |

TABLE 1-1-continued

| | | Laminate | | | | |
|---|---|---|---|---|---|---|
| | Laminated Structure | Surface Treatment of Metal Foil | Thickness of Each Member μm | Thickness of Each Adhesive Layer μm | Adhesive Strength between Metal Foil and Resin Layer N/mm | Total Thickness mm |
| Example 14 | PET/Electrolytic Copper Foil/PET | Roughening Treatment | 100, 18, 100 | 10 | — | 238 |
| Example 15 | PET/SUS/PET | — | 100, 20, 100 | 10 | — | 240 |
| Example 16 | PET/Fe/PET | — | 100, 20, 100 | 6 | — | 232 |
| Example 17 | PET/Ni/PET | — | 100, 20, 100 | 10 | — | 240 |
| Example 18 | PET/Al/PET | — | 25, 10, 25 | 3 | — | 66 |
| Example 19 | PET/Al/PET | — | 50, 20, 50 | 3 | — | 126 |
| Example 20 | PET/Copper Alloy Foil/PET/Copper Alloy Foil/PET/Copper Alloy Foil/PET | Roughening Treatment | 50, 18, 50, 18, 50, 18, 50 | 3 | — | 272 |
| Example 21 | PET/Copper Alloy Foil/PET/Copper Alloy Foil/PET | Roughening Treatment | 100, 35, 100, 35, 100 | 10 | — | 410 |
| Example 22 | PET/Al/PET/Al/PET | — | 50, 20, 50, 20, 50 | 3 | — | 202 |
| Example 23 | PET/Copper Alloy Foil/PET | Roughening Treatment | 25, 9, 25 | 3 | — | 65 |
| Example 24 | PET/Copper Alloy Foil/PET | Roughening Treatment | 50, 18, 50 | 6 | — | 130 |
| Example 25 | PET/Copper Alloy Foil/PET | Ni Plating + Chromate Treatment | 50, 18, 50 | 3 | — | 124 |
| Example 26 | PET/Copper Alloy Foil/PET | Roughening Treatment | 100, 18, 100 | 10 | — | 238 |
| Comparative Example 1 | PET/Pure Copper Foil/PET | Roughening Treatment | 50, 18, 50 | 3 | — | 124 |
| Comparative Example 2 | PET/Copper Alloy Foil/PET | Roughening Treatment | 100, 18, 100 | 10 | — | 238 |
| Comparative Example 3 | SUS | — | 150 | 0 | — | 150 |
| Comparative Example 4 | Pure Copper | — | 200 | 0 | — | 200 |
| Comparative Example 5 | Al | — | 200 | 0 | — | 200 |

TABLE 1-2

| | Properties | | | | Results of Drawing | |
|---|---|---|---|---|---|---|
| | σY MPa | σb/σY | r Value | Dynamic Friction Coefficient | Drawing Depth mm | Evaluation |
| Example 1 | 85 | 1.65 | 2.02 | 0.32 | 15.7 | ◎ |
| Example 2 | 100 | 1.7 | 2.02 | 0.32 | 15.6 | ◎ |
| Example 3 | 75 | 1.52 | 1.5 | 0.25 | 11 | ○ |
| Example 4 | 92 | 1.99 | 3 | 0.29 | 13.7 | ◎ |
| Example 5 | 90 | 1.96 | 3 | 0.29 | 12.3 | ◎ |
| Example 6 | 74 | 1.59 | 0.7 | 0.28 | 8.7 | Δ |
| Example 7 | 85 | 1.88 | 3.8 | 0.29 | 15 3 | ◎ |
| Example 8 | 75 | 1.52 | 1.5 | 0.45 | 11.7 | ○ |
| Example 9 | 75 | 1.52 | 1.5 | 0.15 | 14.4 | ◎ |
| Example 10 | 64 | 1.45 | 1.3 | 0.3 | 7.7 | Δ |
| Example 11 | 81 | 1.42 | 1.5 | 0.3 | 11 | ○ |
| Example 12 | 98 | 1.56 | 0.8 | 0.28 | 11.6 | ○ |
| Example 13 | 93 | 1.53 | 0.8 | 0.25 | 9.5 | ○ |
| Example 14 | 102 | 1.55 | 22 | 0.32 | 10.4 | ○ |
| Example 15 | 110 | 1.44 | 2.02 | 0.32 | 11.5 | ○ |
| Example 16 | 105 | 1.52 | 2.02 | 0.32 | 10.6 | ○ |
| Example 17 | 111 | 1.42 | 2.02 | 0.32 | 9.4 | ○ |
| Example 18 | 88 | 1.64 | 3 | 0.29 | 12.9 | ◎ |
| Example 19 | 88 | 1.8 | 3 | 0.29 | 14.5 | ◎ |
| Example 20 | 86 | 1.86 | 3 | 0.29 | 14 | ◎ |
| Example 21 | 89 | 1.52 | 2.02 | 0.32 | 11.2 | ○ |
| Example 22 | 85 | 1.77 | 3 | 0.29 | 15.1 | ◎ |
| Example 23 | 86 | 1.41 | 0.6 | 0.32 | 63 | Δ |
| Example 24 | 76 | 1.52 | 1.5 | 0.48 | 7.7 | Δ |
| Example 25 | 146 | 1.44 | 1.3 | 0.3 | 8.5 | Δ |
| Example 26 | 132 | 1.42 | 1.3 | 0.3 | 9.2 | ○ |
| Comparative Example 1 | 82 | 1.2 | 1.2 | 0.15 | 5.6 | X |
| Comparative Example 2 | 38 | 1.4 | 0.9 | 0.15 | 4.9 | X |
| Comparative Example 3 | 205 | 2.5 | 1.1 | 0.3 | 4.6 | X |
| Comparative Example 4 | 200 | 1.1 | 0.0 | 0.3 | 4.3 | X |
| Comparative Example 5 | 167 | 2.1 | 0.9 | 0.3 | 4.4 | X |

(9. Discussion)

The laminated bodies according to Examples 1 to 26 each had the appropriate thickness, σY and σb/σY. Therefore, the drawability was excellent. Further, the laminated bodies in which all of σY, σb/σY, the r value and the dynamic friction coefficient were suitable exhibited the highest evaluation for the drawability.

On the other hand, Comparative Example 1 had inappropriate σb/σY and thus exhibited poor drawability as compared with Examples. Comparative Examples 2 to 5 had inappropriate σY values and thus exhibited poor drawability as compared with Examples.

What is claimed is:

1. A laminated body comprising at least one metal foil and at least two resin layers, the at least two resin layers having at least one adhesive layer, the laminated body having a thickness of 25 μm to 500 μm, wherein both surfaces of each metal foil are laminated to the resin layers with an adhesive strength of 0.2 N/mm or more, respectively; and wherein the relationships: $60 \leq Y \leq 150$, and $1.5 \leq \sigma b/\sigma Y$ are satisfied, in which σY represents a nominal stress (MPa) at a nominal strain of 5% when a tensile test according to JIS K 7127:1999 is performed on the laminated body, and σb represents a nominal stress (MPa) at a nominal strain at which the metal foil in the laminated body is broken when a tensile test according to JIS K 7127:1999 is performed on the laminated body.

2. The laminated body according to claim 1, wherein the laminated body has an r value (Lankford value) at a logarithmic strain of 0.4 of from 0.7 to 4.0.

3. The laminated body according to claim 1, wherein the surfaces of the resin layers forming both outermost layers comprise a dynamic friction coefficient of from 0.15 to 0.45.

4. The laminated body according to claim 1, wherein both sides of each metal foil are laminated to the resin layers with an adhesive strength of 0.6 N/mm or more, respectively.

5. The laminated body according to claim 1, wherein each metal foil has a thickness of 4 μm to 100 μm.

6. The laminated body according to claim 1, wherein each resin layer has a thickness of 9 μm to 500 μm.

7. A method of producing a shaped article, comprising molding the laminated body according to claim 1.

8. The method of producing the shaped article according to claim 7, wherein the method comprises carrying out the molding by drawing.

* * * * *